United States Patent [19]
Lee

[11] Patent Number: 5,956,268
[45] Date of Patent: Sep. 21, 1999

[54] NONVOLATILE MEMORY STRUCTURE

[75] Inventor: Jong Seuk Lee, Kgouriggido, Rep. of Korea

[73] Assignee: Hyundai Electronics America, San Jose, Calif.

[21] Appl. No.: 09/023,019

[22] Filed: Feb. 11, 1998

Related U.S. Application Data
[60] Provisional application No. 60/037,911, Feb. 12, 1997.

[51] Int. Cl.$^6$ ................................................ G11C 16/04
[52] U.S. Cl. ................................ 365/185.03; 365/185.05
[58] Field of Search ........................ 365/185.03, 185.15, 365/185.22, 185.24, 185.28, 185.29, 185.05; 257/314, 315

[56] References Cited

U.S. PATENT DOCUMENTS

| | | | |
|---|---|---|---|
| 5,126,808 | 6/1992 | Montalvo et al. | 357/23.5 |
| 5,172,338 | 12/1992 | Mehrotra et al. | 365/185 |
| 5,191,556 | 3/1993 | Radjy | 365/235 |
| 5,198,380 | 3/1993 | Harari | 437/43 |
| 5,278,785 | 1/1994 | Hazani | 365/182 |
| 5,280,454 | 1/1994 | Tanaka et al. | 365/218 |
| 5,289,429 | 2/1994 | Watanabe | 365/230.06 |
| 5,297,148 | 3/1994 | Harari et al. | 371/10.2 |
| 5,300,802 | 4/1994 | Komori et al. | 257/316 |
| 5,315,541 | 5/1994 | Harari et al. | 365/63 |
| 5,315,547 | 5/1994 | Shoji et al. | 365/185 |
| 5,349,558 | 9/1994 | Cleveland et al. | 365/200 |
| 5,365,484 | 11/1994 | Cleveland et al. | 365/218 |
| 5,418,752 | 5/1995 | Harari et al. | 365/218 |
| 5,438,542 | 8/1995 | Atsumi et al. | 365/182 |
| 5,440,509 | 8/1995 | Momodomi et al. | 365/185 |
| 5,475,647 | 12/1995 | Yim et al. | 365/230.03 |
| 5,477,499 | 12/1995 | Van Buskirk et al. | 365/218 |
| 5,491,657 | 2/1996 | Haddad et al. | 365/185.27 |
| 5,495,442 | 2/1996 | Cernea et al. | 365/185.03 |
| 5,515,333 | 5/1996 | Fujita et al. | 365/229 |
| 5,523,972 | 6/1996 | Rashid et al. | 365/185.22 |
| 5,530,828 | 6/1996 | Kaki et al. | 395/430 |
| 5,532,964 | 7/1996 | Cernea et al. | 365/189.09 |

(List continued on next page.)

OTHER PUBLICATIONS

Nonvolatile Semiconductor Memories: Technology, Design and Applications, by Chenming Hu, © 1991, IEEE Press, ISBN 0–87942–269–6, pp. 206–208, Month Unavailable.

Semiconductor Memories (2nd ed.), by Prince and Due–Genderson, © 1983, 1991, John Wiley & Sons, Ltd., Jan. 1996 printing, ISBN 04–71–92465–2, pp. 568–604.

Principles of CMOS VLSI Design: A Systems Perspective (2nd ed.), by Weste and Eshraghian, © 1993 AT&T, Published by Addison–Wesley Publishing Company, Oct. 1994 printing, ISBN 02021–53376–6, Chapter 2: MOS Transistor Theory.

(List continued on next page.)

*Primary Examiner*—David Nelms
*Assistant Examiner*—Anh Phung
*Attorney, Agent, or Firm*—Townsend and Townsend and Crew LLP

[57] ABSTRACT

The present invention provides a novel nonvolatile Flash EEPROM array design which allows for array, block or sector erase capabilities. The relatively simple transistor design layout of the present invention allows small portions of the EEPROM array to be erased without affecting data stored in the remaining portion of the array. In addition, given the block structured layout of the Flash EEPROM array, adjacent blocks in the array can share transistor control circuitry, thus minimizing the size of the array. The novel nonvolatile Flash EEPROM array preferably comprises a plurality of blocks which comprise a plurality of sectors of NOR-gate transistors. Each transistor has a drain, a source, and a control gate. Preferably, the drains of each transistor in a column are electrically coupled, the control gates of each transistor in a row are electrically coupled, and the sources of all the transistors in a sector are electrically coupled. A sector of the nonvolatile Flash EEPROM array preferably comprises 8 rows and 512 columns of transistors and a block preferably comprises 128 vertically stacked sectors.

44 Claims, 6 Drawing Sheets

U.S. PATENT DOCUMENTS

| | | | |
|---|---|---|---|
| 5,535,328 | 7/1996 | Harari et al. | 395/182.05 |
| 5,537,350 | 7/1996 | Larsen et al. | 365/185.33 |
| 5,541,886 | 7/1996 | Hasbun | 365/230.01 |
| 5,544,356 | 8/1996 | Robinson et al. | 395/600 |
| 5,546,348 | 8/1996 | Honma et al. | 365/230.03 |
| 5,557,570 | 9/1996 | Iwahashi | 365/185.29 |
| 5,559,956 | 9/1996 | Sukegawa | 395/182.06 |
| 5,561,620 | 10/1996 | Chen et al. | 365/218 |
| 5,579,259 | 11/1996 | Samachisa et al. | 365/185.14 |
| 5,581,723 | 12/1996 | Hasbun et al. | 395/430 |
| 5,592,419 | 1/1997 | Akaogi et al. | 365/185.18 |
| 5,592,641 | 1/1997 | Fandrich et al. | 395/430 |
| 5,592,669 | 1/1997 | Robinson et al. | 395/622 |
| 5,602,987 | 2/1997 | Harari et al. | 395/182.06 |
| 5,603,001 | 2/1997 | Sukegawa et al. | 395/430 |
| 5,606,529 | 2/1997 | Honma et al. | 365/230.03 |
| 5,608,673 | 3/1997 | Rhee | 365/185.33 |
| 5,623,445 | 4/1997 | Naruke et al. | 365/185.29 |
| 5,781,476 | 7/1976 | Seki et al. | 365/185.22 |

OTHER PUBLICATIONS

An Experimental 4–Mbit CMOS EEPROM with a NAND–Structured Cell; Masaki Momodomi, Yasuo Itoh, Riichiro Shirota, Yoshihisa Iwata, Ryozo Nakayama, Ryouhei Kirisawa, Tomoharu Tanaka, Seiichi Aritome, Tetsuo Endoh, Kazunori Ohuchi and Fujio Masuoka; IEEE Journal of Solid–State Circuits, vol. 24, No. 5; Oct. 1989.

A High–Density NAND EEPROM with Block–Page Programming for Microcomputer Applications; Yoshihisa Iwata, Masaki Momodomi, Tomoharu Tanaka, Hideko oodaira, Riichiro Shirota, Kazunori Ohuchi and Fuji Masuoka; IEEE Journal of Solid–State Circuits, vol. 25, No. 2; Apr. 1990.

A 90–ns One Million Erase/Program Cycle 1–Mbit Flash Memory, by Kynett et al., IEEE Journal of Solid State Circuits, vol. 24, No. 5, Oct. 1989, pp. 1259–1264.

120–ns 128K X 8–bit/64K X 16–bit CMOS EEPROM's, by Terada et al., IEEE Journal of Solid State Circuits, vol. 24, No. 5, Oct. 1989, pp. 1244–1249.

A 60ns 16 Mb Flash EEPROM with Program and Erase Sequence Controller, by Nakayama et al., IEEE 1991 International Solid–State Circuits Conference, pp. 260, 261, 326.

A 62ns 16Mb CMOS EPROM with Address Transition Detection Technique, by Ohtsuka et al., IEEE 1991 International Solid–State Circuits Conference, pp. 262, 263, 326.

A 29ns 8Mb EPROM with Dual Reference–Column ATD Sensing, by Sweha et al., IEEE 1991 International Solid–State Circuits Conference, pp. 264, 265, 327.

NONVOLATILE MEMORY STRUCTURE

CROSS-REFERENCE TO RELATED APPLICATION

This application claims the benefit of U.S. Provisional Application No. 60/037,911 filed Feb. 12, 1997, incorporated herein by reference.

BACKGROUND OF THE INVENTION

The present invention relates generally to nonvolatile memory devices and more specifically to a Flash EEPROM memory design utilizing a novel NOR-gate transistor array architecture.

Most computers currently use magnetic disk drives for data storage. However, disk drives tend to be bulky and have a number of moving parts. Consequently, they are prone to reliability problems and consume a significant amount of power. Moreover, as PC's and other digital devices such as cameras and PDA's become smaller and smaller, magnetic disk drive storage becomes even more impractical.

Recently, Flash electrically erasable programmable read-only memory (EEPROM) has emerged as a new source of nonvolatile memory storage. Flash EEPROM memory devices typically comprise an array of floating gate transistors for storing data in digital form.

FIG. 1 illustrates the cross-section of a typical NMOS floating gate transistor cell 100 used in Flash EEPROM devices. NMOS transistor cell 100 typically comprises a p-type substrate 102 having a drain region 104 and a source region 106. Drain region 104 and source region 106 typically consist of N+ diffusion regions within p-type substrate 102. A channel region 108 in substrate 102 separates drain region 104 from source region 108.

Positioned above substrate 102 and drain and source regions 104, 106 are a floating gate 110 and a control gate 112, both which typically are formed of polysilicon. Floating gate 110 is separated from substrate 102 by a thin dielectric layer 114, which in most cases, comprises silicon dioxide. Similarly, a dielectric layer 116 separates floating gate 110 and control gate 112. The entire structure is overlaid by an oxide insulating layer 118, and means are provided for applying a source voltage $V_S$ through oxide layer 118 to source region 106, a gate voltage $V_G$ to control gate 112, and a drain voltage $V_D$ through oxide layer 118 to drain region 104.

To program Flash EEPROM transistor cell 100, drain 104 and control gate 112 are raised to voltage potentials above the voltage potential of source 106. For example, drain 104 is raised to a potential $V_D$ of about 5 volts and control gate 112 is raised to a potential $V_G$ of about 12 volts. Source 106 is typically grounded. As illustrated in FIG. 1, under such conditions, the current generates hot electrons which become trapped in floating gate 110. This electron injection increases the floating gate threshold by about 3 to 5 volts.

To erase the Flash EEPROM transistor cell 100, drain 104 is typically floated, control gate 112 is grounded and a voltage of about 9 to 12 volts is applied to source 106 for a few milliseconds. As a result, the electrons stored on the floating gate 110 will tunnel through dielectric 114 to drain 104.

Finally, to read cell 100 (i.e., to determine whether a one or a zero is stored in the cell), source 106 is typically held at: ground potential and a voltage of about 5 volts is applied to control gate 112. A potential of about 1 to 2 volts is applied to drain 104. Under these conditions, an unprogrammed cell (i.e., no electrons on the floating gate) conducts a current of about 25 to 50 microamps. A programmed cell does not conduct.

As illustrated in FIG. 2, a typical Flash EEPROM array 200 comprises a plurality of transistors 202 arranged in rows and columns. In accordance with this well known arrangement, the drains D of each cell 202 in a column are connected to a common bit line 204. Similarly, the control gates of each cell 202 in each row are connected to a common word line 206. The source lines of all the cells 202 in the entire array are tied to a common source line 208.

With this configuration, cells 202 of array 200 may be individually programmed, but all the cells in array 200 are erased simultaneously because the sources of all the cells are tied together. Thus, to re-program any portion of the array, the entire array first must be erased and then re-programmed. If some of the information stored in the array is to remain the same, that information must be saved in memory during the erase process and then re-programmed back into the array. As one skilled in the art can appreciate, a complex control and memory system is needed to program this type of Flash EEPROM array.

Various different Flash EEPROM array designs have been developed to overcome some of the problems associated with having to erase an entire memory array before re-programming it. For example, NAND-gate transistor Flash EEPROM designs have been developed to overcome some of the large block erasing problems associated with the NOR-gate designs. See, for example, "An Experimental 4-Mbit CMOS EEPROM with a NAND-Structured Cell," M. Momodomi, et al., *IEEE Journal of Solid-State Circuits*, vol. 24, No. 5, Oct. 1989, pp. 1238–1243, and "A High-Density NAND EEPROM with Block-Page Programming for Microcomputer Applications," Y. Iwata, et al., *IEEE Journal of Solid-State Circuits*, vol. 25, No. 2, April 1990, pp. 417–424. However, while these NAND-gate transistor designs allow for smaller sector sizes and, thus, smaller block erasures, they also tend to have more overhead, causing much slower processing speeds.

Thus, a NOR-gate Flash EEPROM design which permits easy erasing and programming control of smaller transistor sectors and blocks is needed which overcomes the shortcomings of the prior art.

SUMMARY OF THE INVENTION

The present invention provides a novel nonvolatile Flash EEPROM array design which allows for array, block or sector erase capabilities. The relatively simple transistor design layout of the present invention allows small portions of the EEPROM array to be erased without affecting data stored in the remaining portions of the array. In addition, given the block structured layout of the Flash EEPROM array of the present invention, adjacent blocks in the array can share transistor control circuitry, thus minimizing the size of the array.

According to one aspect of the present invention, the novel nonvolatile Flash EEPROM array comprises a NOR-gate transistor matrix having at least two rows and two columns of transistors. Each transistor has a drain, a source, and a control gate. In accordance with a preferred embodiment of the invention, the drains of each transistor in a column are electrically coupled, the control gates of each transistor in a row are electrically coupled, and the sources of all the transistors in the matrix are electrically coupled.

In accordance with another aspect of the present invention, a sector of the nonvolatile Flash EEPROM array preferably comprises 8 rows and 512 columns of transistors in which the drains in each column of the sector are electrically coupled, the control gates in each row of the sector are electrically coupled and all the sources within the sector are electrically coupled. In accordance with this aspect of the invention, a sector preferably comprises 512 bytes of nonvolatile memory.

In accordance with yet another aspect of the present invention, a block of the nonvolatile Flash EEPROM array preferably comprises a plurality of vertically stacked sectors. In accordance with this aspect of the invention, the drains of all transistors within a column of the block are electrically coupled with a common bit line. That is, the drains in a column of one sector are electrically coupled to the drains in the corresponding column of adjacent sectors. In this manner, a block comprises a plurality of continuous columns.

Also, as with the sector design of the present invention, the control gates in each row of the block are electrically coupled. However, in accordance with a preferred embodiment of the invention, only the sources within each sector are coupled together. The common sources in each sector are not tied to the common sources of other sectors in the block.

In accordance with yet another aspect of the present invention, a block preferably comprises 128 vertically stacked sectors. In accordance with this aspect of the invention, a block preferably comprises 64 Kbytes of nonvolatile memory.

In accordance with still another aspect of the present invention, the nonvolatile Flash EEPROM array may comprise a plurality of rows and\or columns of blocks, and adjacent blocks can share control circuitry.

DESCRIPTION OF THE PREFERRED EMBODIMENT

The present invention provides a novel nonvolatile Flash EEPROM array design which allows for array, block or sector erase capabilities. Accordingly, a portion (i.e., a block or sector) of the memory array of the present invention can be erased and re-programmed with new data without affecting the entire array. While the preferred embodiment of the present invention is described herein with reference to a specific number of transistors in a sector and a specific number of sectors in a block, one skilled in the art will appreciate that any number of transistor may make-up a sector, and any number of sectors may make-up a block. Moreover, any number of blocks may be combined to form the entire Flash EEPROM array. Accordingly, the present invention is not limited to the specific embodiments disclosed herein.

In the figures, similar components and/or features have the same reference label. The various components are distinguished by following the reference label by a dash and a second label that distinguishes among the similar components. If only the first reference label is used, the description is applicable to any one of the several similar components.

Figure 1:
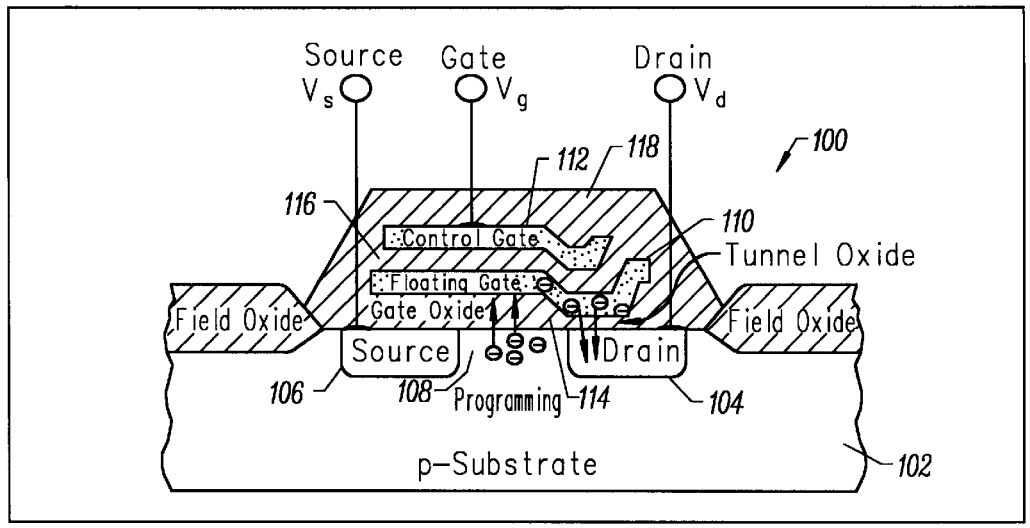
FIG. 1 is a side cross-sectional view of a typical NMOS floating gate transistor.
Figure 2:
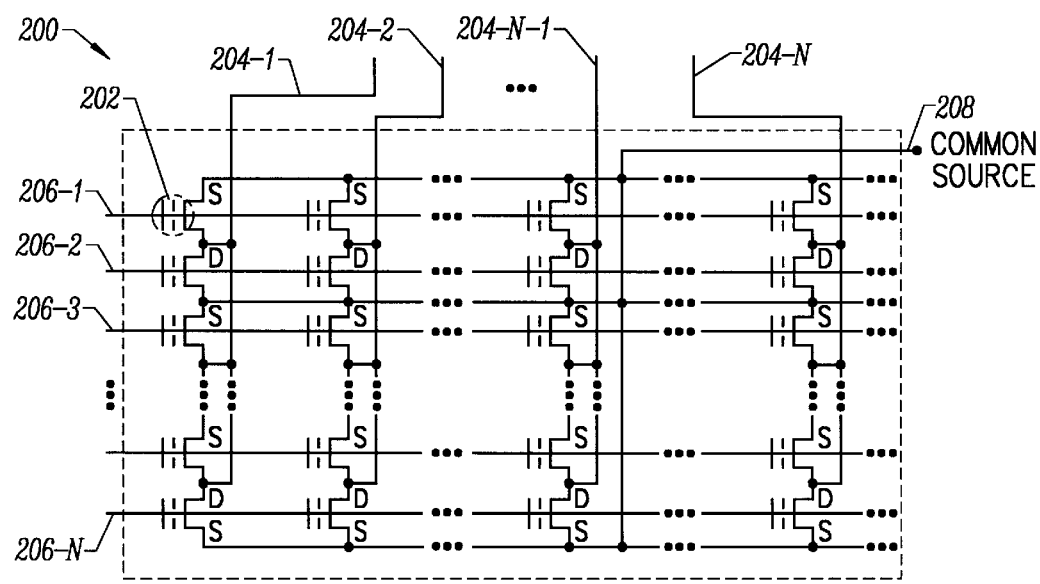
FIG. 2 is a schematic diagram of a prior art Flash EEPROM transistor array configuration.
Figure 3:
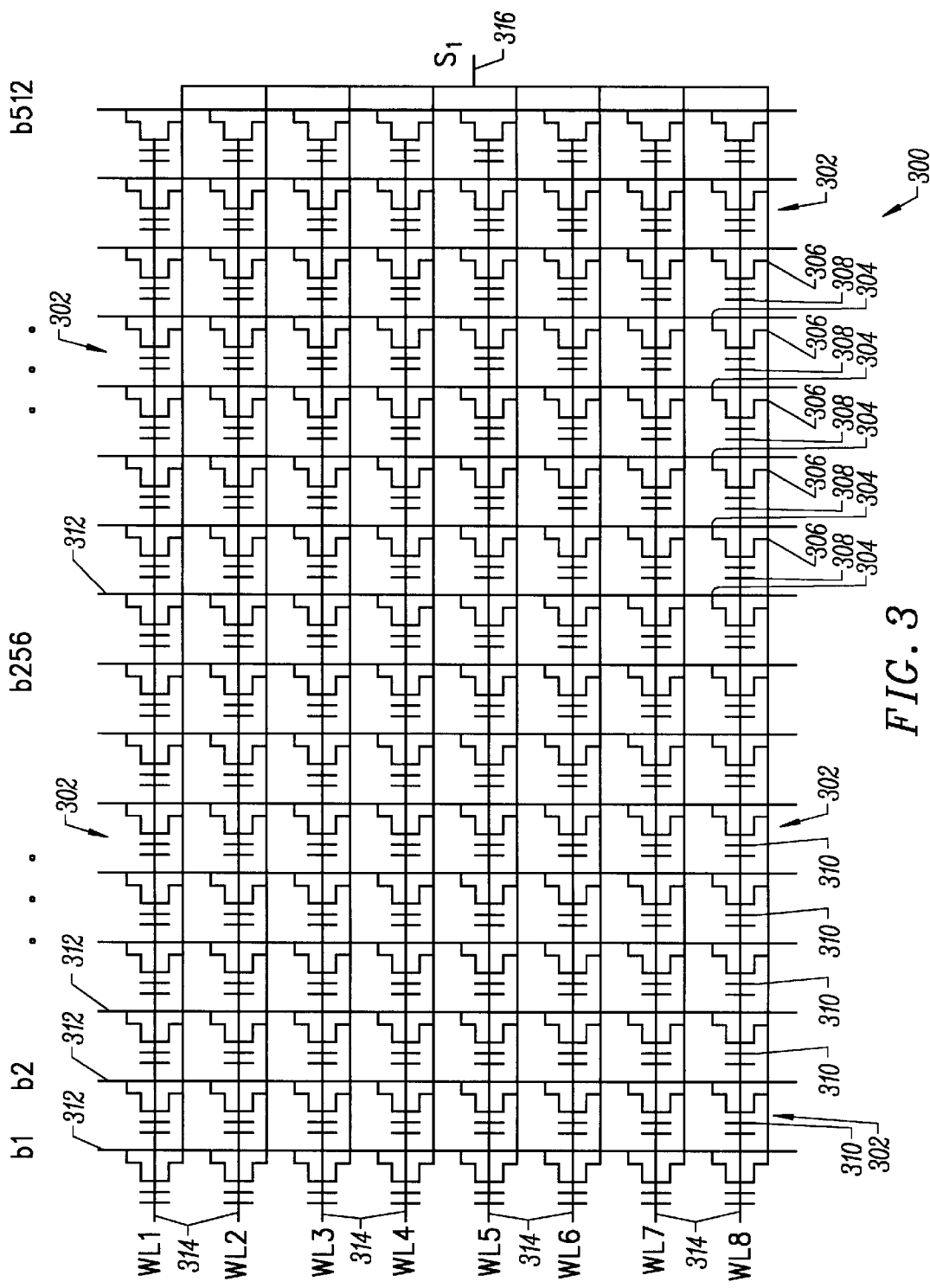
FIG. 3 is a schematic diagram of the transistor configuration of one sector of the Flash EEPROM design of the present invention.

Referring now to FIG. 3, a sector of Flash EEPROM memory 300 preferably comprises a plurality of MOS NOR-gate transistor cells 302 arranged in rows and columns. In accordance with a preferred embodiment, sector 300 comprises 8 rows and 512 columns of transistor cells 302. Thus, in accordance with this aspect of the present invention, sector 300 is configured to store 512 bytes of data; each column being 8 bits or 1 byte of data.

Each transistor cell 302 comprises a drain 304, a source 306, a control gate 308, and a floating gate 310. As illustrated in FIG. 3, drains 304 of each cell 302 in a column are connected via a bit line 312. Similarly, control gates 308 of each cell 302 in a row are connected via a word line 314. Sources 306 of each cell 302 in sector 300 are connected to a single source connection 316.

Figure 4:
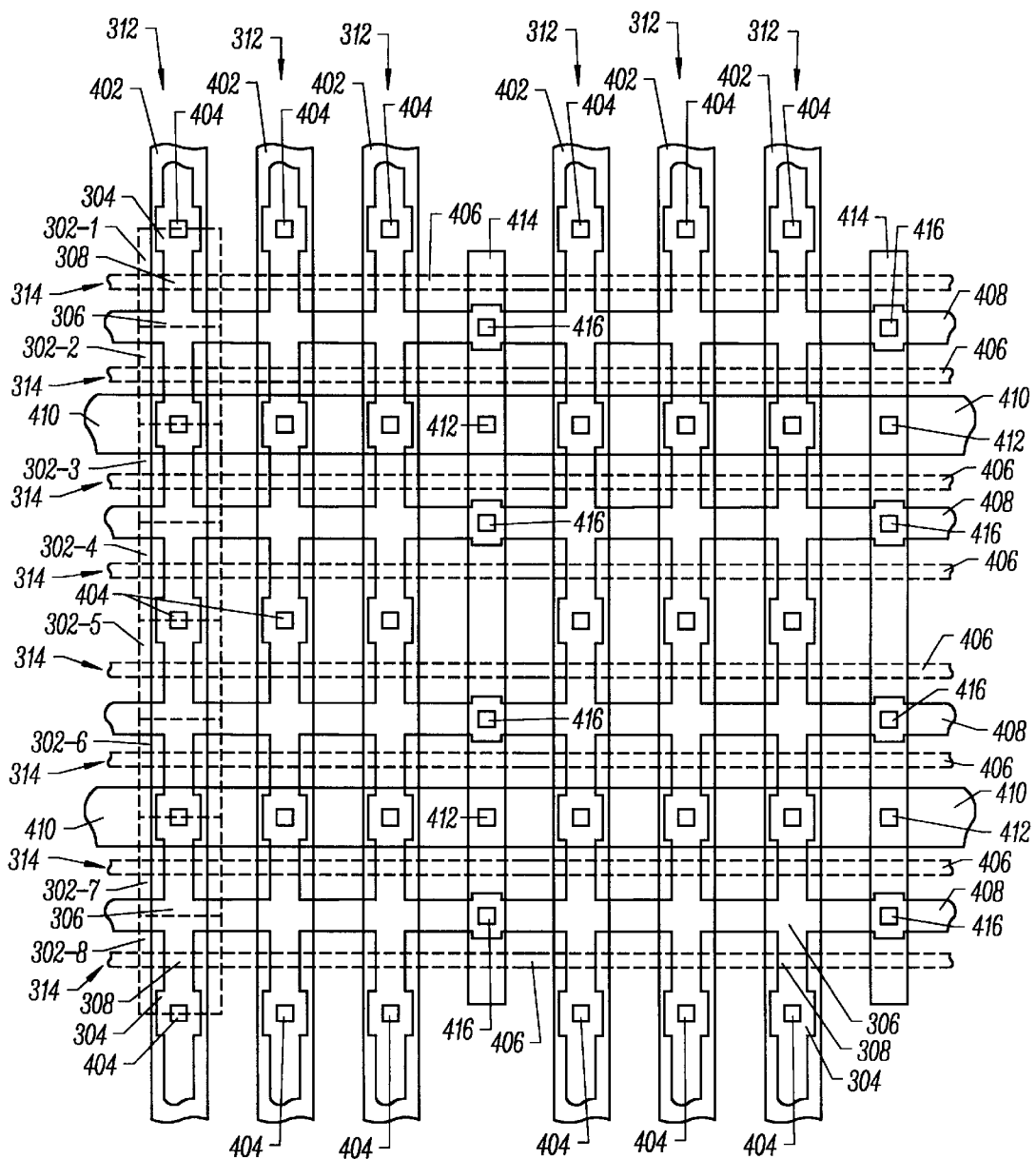
FIG. 4 is a top plan view of a circuit layout of a portion of the sector shown in FIG. 3.

FIG. 4 illustrates the layout of transistor cells 302 of a portion of sector 300. As shown in FIG. 4, transistor cells 302 in a column (i.e., along bit line 312) may share common source wells 306 and common drain wells 304. For example, in accordance with the illustrated embodiment, transistor cell 302-1 shares a common source well 306 with transistor cell 302-2, and transistor cell 302-2 shares a common drain well 304 with cell 302-3. Similarly, transistor cell 302-3 shares a common source well 306 with transistor cell 302-4, and so on. This configuration allows the transistors to be more densely packed in the array, thus, permitting greater storage capacity in an area smaller than other NOR-gate Flash EEPROM devices currently known in the art.

As mentioned previously with reference to FIG. 3, drains 304 of cells 302 in a column are connected via bit line 312. As illustrated more clearly in FIG. 4, bit lines 312 preferably comprise first metal lines 402 connected to drains 304 by metal to N+ diffusion vias 404. In accordance with this aspect of the invention, by connecting all cells 302 in a column with bit line 312, and transistor cells 302 along the bit line may be controlled by a common bit line driver, column selector, and sense amplifier, thus reducing the analog circuitry overhead necessary for implementing the memory device.

Control gates 308 of transistor cells 302 in a row are all connected via word line 314, which, in accordance with a preferred embodiment, is a polysilicon layer 406. As one skilled in the art will appreciate, polysilicon layer 406 forms the actual control gates 308 of the transistor cells, as well as the connections between the adjacent gates 308. Floating gates 310 of transistor cells 302 also preferably are formed of polysilicon, but are not connected between the individual transistor cells. The polysilicon floating gates 310 typically reside below polysilicon layer 406 but, for clarity, are not illustrated in FIG. 4.

As mentioned previously, sources 306 of each transistor cell 302 in a sector are tied to a common source connection 316. In accordance with a preferred embodiment of the present invention, all sources 306 of transistor cells 302 in a common row are coupled together with an N+ diffusion layer/line 408. As one skilled in the art will appreciate, N+ diffusion layer 408 forms the source wells 306 of each transistor cell 302, as well as connects source wells 306 along a row.

In order for all sources 306 within sector 300 to be tied to single source connection 316, N+ diffusion lines 408 preferably are tied together within sector 300. As illustrated in FIG. 4, one or more second metal lines 414 run perpendicular to N+ diffusion lines 408 and are connected to N+ diffusion lines 408 with metal to N+ diffusion vias 416. In this manner, second metal lines 414 interconnect all the parallel N+ diffusion lines 408 in sector 300, effectively linking all sources 306 in sector 300 to common source connection 316. As one skilled in the art will appreciate, second metal lines 414 may reside either at the same fabrication layer or at a different fabrication layer as first metal lines 402. However, in accordance with a preferred embodiment of the present invention, second metal lines 414 reside at the same layer as first metal lines 402.

In addition, one or more third metal lines 410 preferably run parallel to N+ diffusion lines 408 and connect to second metal lines 414 with metal to metal vias 412. By connecting third metal lines 410 to N+ diffusion lines 408 via second metal lines 414, the overall resistance of N+ diffusion lines 408 are effectively reduced, thus reducing the power requirements of the Flash EEPROM array. In accordance with a preferred embodiment of the invention, third metal lines 410 are located at different layer from first and second metal lines 402, 414.

While the illustrated embodiment shows second metal lines 414 positioned between about every third bit line 312, one skilled in the art will appreciate that second metal lines 414 may have any suitable spacing in sector 300. For example, first metal lines can be positioned between about every 16 lines 312 or every 32 lines 312, depending on the resistance of the N+ lines between one contact (416) and another contact (416). Alternatively, only one second metal line 414 may be utilized. Similarly, while the illustrated embodiment shows third menntal lines 410 positioned over about every other row of drains 304, one should appreciate that any number of third metal lines 410 may be used. For example, third metal lines 410 may be positioned directly over and coupled to N+ diffusion lines 408 with metal to N+ diffusion vias. Alternatively, only one third metal line 410 may be utilized. Accordingly, the present invention is not limited to the illustrated embodiment.

Figure 5:
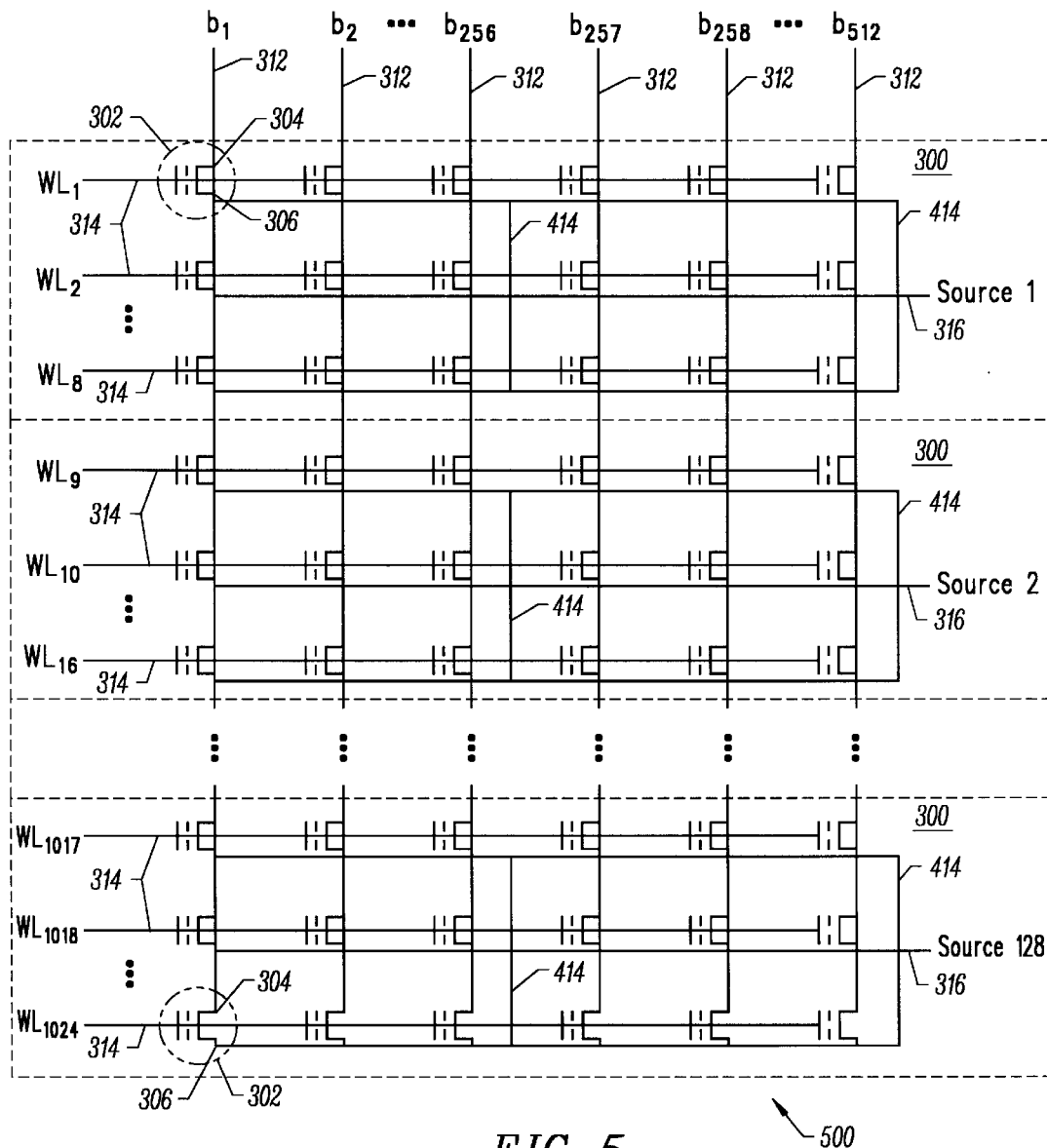
FIG. 5 is a schematic diagram of the transistor configuration of one block of the Flash EEPROM design of the present invention.

Referring now to FIG. 5, a memory block 500 of the Flash EEPROM array of the present invention is illustrated. In particular, block 500 preferably comprises a plurality of sectors 300 stacked vertically one on top of the next. All drains 304 of transistor cells 302 in a column of block 500 are connected to a common bit line 312 via first metal lines 402 (see FIG. 4). In this manner, the vertically stacked sectors 300 all share common bit lines 312. Also, just as transistor cells 302 within a column of a sector can share common source 306 and drain 304 wells (see FIG. 4), transistor cells 302 in adjacent sectors 300 within block 500 can also share common source 306 and drain 304 wells. As mentioned previously, this configuration permits the transistors to be more densely packed within the array. Also, by sharing common bit lines between sectors 300, the total number of bit line drivers, sense amplifiers and column selectors are reduced.

Figure 6:
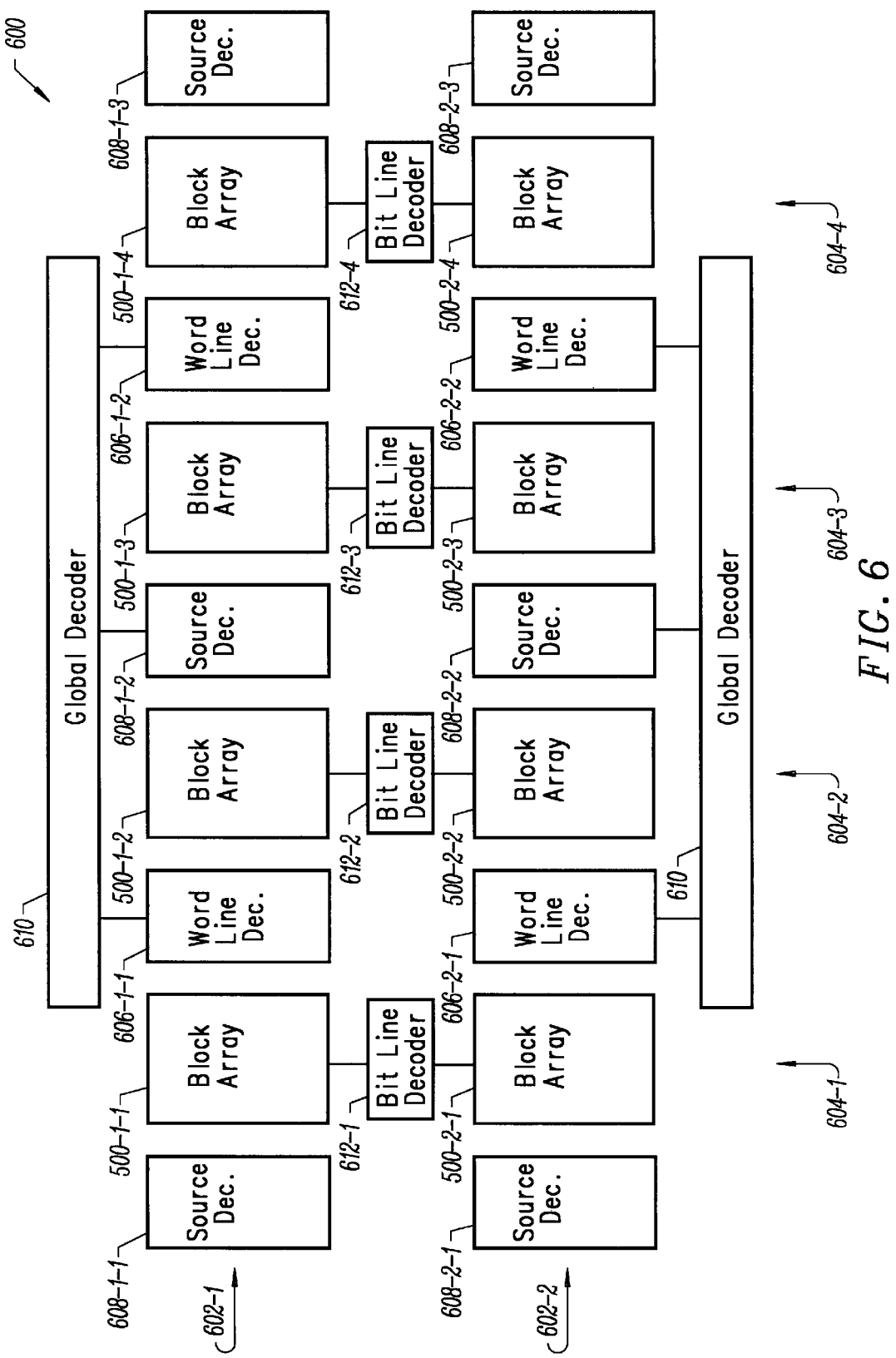
FIG. 6 is a block diagram of the Flash EEPROM planar array of the present invention.

In accordance with a preferred embodiment of the invention, block 500 preferably comprises 128 stacked sectors 300. Accordingly, each block 500 comprises 1024 word lines 314 (8 per sector), 128 source connections 316 (one for each sector), and 512 bit lines 312. Thus, block 500 can store up to 64 Kbytes of information:

1 sector=512 columns and 8 rows of transistors=512 bytes of storage 1 block=128 sectors=512 bytes=64 Kbytes of storage Referring now to FIG. 6, a preferred embodiment of a nonvolatile Flash EEPROM planar array 600 of the present invention is illustrated. Planar array 600 preferably comprises a plurality of blocks 500 aligned in a one or two dimensional configuration. In accordance with the illustrated embodiment, two rows 602 and four columns 604 of blocks 500 are shown.

To control the operation of planar array 600, word line decoders 606, source decoders 608, global decoders 610, and bit line decoders 612 are used. As illustrated in FIG. 6, adjacent horizontal blocks 500 share word line decoders 606 and source decoders 608. For example, in row 602-1 of FIG. 6, block 500-1-1 shares word line decoder 606-1-1 with block 500-1-2, and block 500-1-3 shares word line decoder 606-1-2 with block 5-1-4. Similarly, blocks 500-1-2 and 500-1-3 share source decoder 608-1-2. The second row 602-2 of planar array 600 is similarly configured. -Also, in accordance with a preferred embodiment of the present invention, planar array 600 is configured so that vertically adjacent blocks 500 share bit line drivers, column selectors and sense amplifiers. For clarity purposes bit line drivers, column selectors and sense amplifiers have been grouped together as bit line decoders 612. However, one skilled in the art will appreciate that these components may comprise separate circuitry and they need not be group as one component.

In reading, writing and erasing planar array 600 or any block 500 or sector 300 therein, a controller (not shown) typically sends control signals to the various decoders 606–612, directing the decoders to apply suitable voltages to the various bit lines 312, word lines 314 and source connections 316 of the transistors cells 302 being read, written to, or erased. For example, to read one or more transistor cells 302 in planar array 600, the controller sends the appropriate signals to the specific word line decoder(s) 606, source decoder(s) 608, global decoder(s) 610, and bit line decoder(s) 612 which control the particular transistor cells 302 being read. The various decoders 606-612 then control the voltages on the particular word lines 314, bit lines 312, and common source connections 316 connected to the particular transistor cells 302 being read. Similar operations occur for the write and erase processes.

To read a transistor cells 302 in planar array 600, a voltage in the range of about 4 to about 7 volts and preferably about 5 volts is applied to control gate 308 of the transistor cell being read via word line 314. Similarly, source 306 preferably are grounded and the voltage on drain 304 is measured using bit line decoder 612. In accordance with this aspect of the invention, transistor cell 302 is programmed with a zero (0) if the voltage on drain 304 is in the range of about 0.5 to about 2 volts and preferably about 1 volt. Transistor cell 302 contains a one (1) if no voltage is detected on drain 304.

In accordance with another embodiment of the present -invention, instead of detecting the voltage on drain 304 to read transistor cell 302, a voltage of about 0.5 to about 2 volts and preferably about 1 volt is applied to drain 304 via bit line 312, and the current flow in transistor cell 302 is detected using bit line decoder 612. An unprogrammed cell typically conducts about 25 to 50 microamps. A programmed cell does not conduct.

Similarly, to program a transistor cell 302 in EEPROM array 600, a voltage in the range of about 4 to about 7 volts and preferably about 5 volts is applied to control gate 308 of the transistor cell being programmed via word line 314. In addition, source 306 of the transistor cell preferably is grounded and a voltage in the range of about 5 to about 9 volts and preferably about 6 volts is applied to drain 304. Under these conditions, electrons from the P-substrate of the transistor cell tunnel through an oxide layer to floating gate 310, thus "programming" a zero (0) therein.

Finally, in accordance with the present invention, the erase function preferably is performed on one or more sectors 300 or one or more blocks 500 of EEPROM array 600. Thus, to erase one or more sectors 300, all control gates 308 in sector(s) 300 preferably are grounded, all drains 304 are allowed to float, and a voltage in the range of about 8 to about 12 volts and preferably about 9.5 volts is applied to all sources 306 via common source connection 316. Under these conditions, electrons that were placed in floating gates 310 during the programming process tunnel back through the oxide insulating layer and into drains 304. In accordance with this aspect of the invention, transistor cells 302 within the sector(s) 300 being erased which were initially programmed with a zero (0) are "erased" back to a one (1) state (i.e., no voltage is detected on drain 304 during the read process.

Given the particular configuration of the EEPROM array of the present invention, one or more transistor cells 302 can be read or programmed at any particular time. However, to erase a transistor cell in a particular sector, the entire sector must be erased. Accordingly, each source decoder 608 is configured to control the voltage potentials on each one of the 128 common source connections 316 in block 500. In accordance with this aspect of the invention, during the erase process, source decoder 608 applies a suitable voltage to or "selects" one or more entire sectors at a time. If source decoder 608 is shared by two or more blocks 500, source decoder 608 preferably is configured to control the sectors in the blocks separately. For example, referring to FIG. 6, source decoder 608-1-2 can select a specific sector 300 in block 500-1-2 and a different sector 300 in block 500-1-3 simultaneously.

Similarly, each bit line decoder 612 is configured to control each one of the 512 bit lines 312 in block 500 separately, and each word line decoder 606 is configured to control each one of the 1024 word lines 314 in block 500 separately. Thus, specific transistor cells 302 within a particular sector can be read or programmed by applying suitable voltages to specific bit lines 312 and word lines 314 within the sector. For example, to program one or more transistor cells 302 within a sector of block 500-1-1, suitable voltages are applied to the drains 304 and control gates 308 of the particular transistor cells 302 by bit line decoder 612-1 and word line decoder 606-1-1, respectively.

Figure 7:
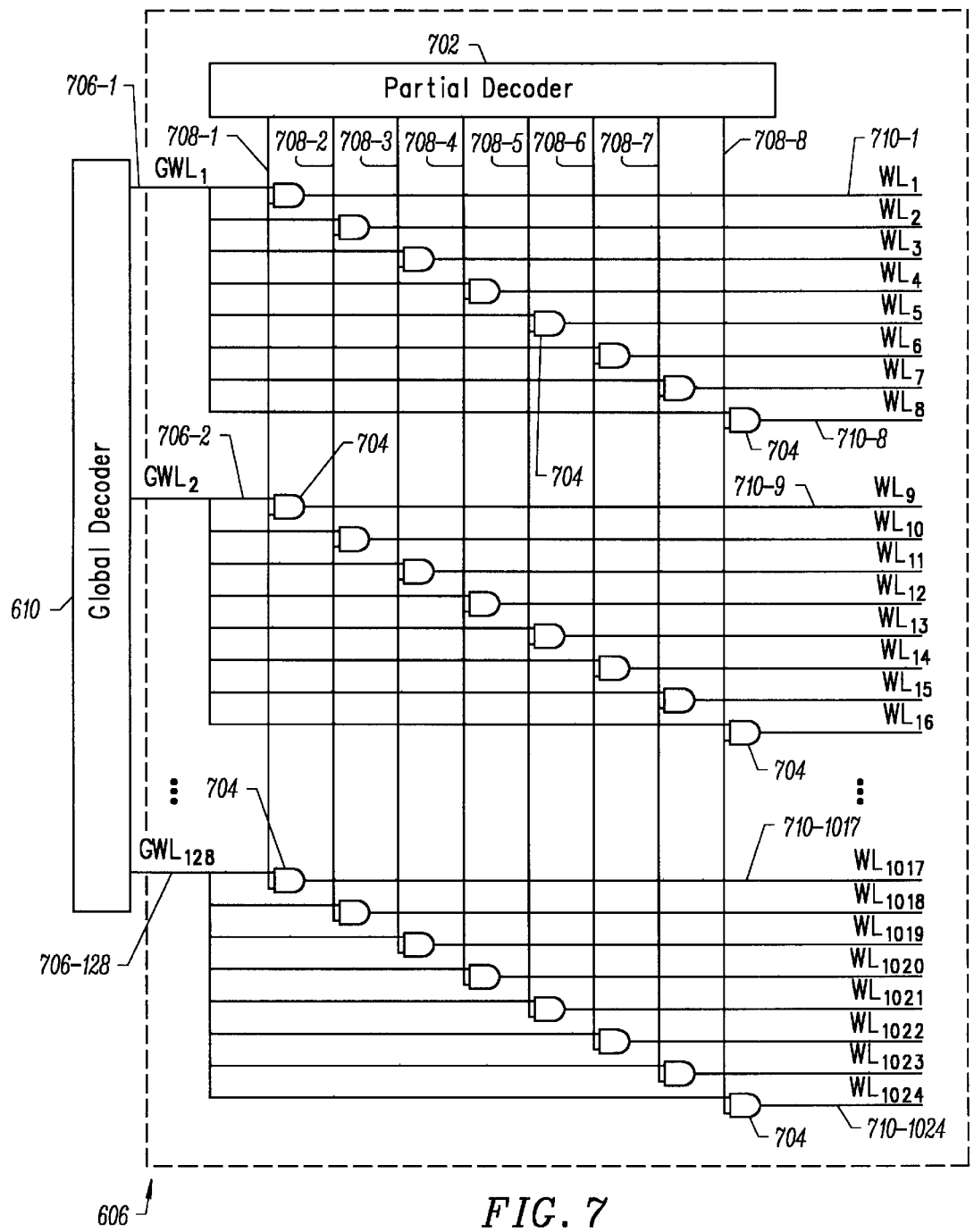
FIG. 7 is a circuit diagram of a local decoder used in the embodiment of the Flash EEPROM planar array illustrated in FIG. 6.

Referring now to FIG. 7, the configuration and operation of word line decoder 606 will be discussed. Specifically, word line decoder 606 is electrically coupled to a global decoder 610 and comprises a partial decoder 702 and a plurality of AND-gates 704. Global decoder 610 receives control signals from a controller and generates a plurality of outputs 706 which act as inputs to AND-gates 704. In accordance with a preferred embodiment of the present invention, global decoder 610 includes 128 outputs 706, one for each sector 300 in block 500.

Similarly, partial decoder 702 receives control signals from the controller and generates a plurality of outputs 708 (preferably 8) which also act as inputs to AND-gates 704. The combination of input signals from global decoder 610 and partial decoder 702 generates signals which control one or more word lines 314 in block 500 (See FIGS. 3–5). In accordance with this aspect of the invention, the output of word -Line decoder 606 is a plurality of word line connections 710 which are configured to electrically couple to word lines 314. In accordance with a preferred embodiment, word line decoder 606 comprises 1024 word line connections 710; one for each word line 314 in block 500.

For example, for word line decoder 606 to apply a voltage to or "select" the word line WL12 (see FIG. 7), global decoder 610 generates a signal on output 706-2 pursuant to a control signal from the controller. Similarly, partial decoder 702 generates a signal on partial decoder output 708-4. AND-gate 704 combines the two signals and generates a signal on word line connection 710-12 which is coupled to word line WL12. As one skilled in the art will appreciate, a particular AND-gate 704 will not generate an output unless both the global decoder 606 and the partial decoder 702 transmit high voltages to the particular AND-gate.

To select all word lines 314 within a sector, global decoder 606 generates a high voltage signal for the particular sector selected, and all eight partial decoder outputs 708 are sent high. In accordance with this aspect of the invention, the combination of the output(s) from global decoder 606 with the high outputs from partial decoder 702 produces high voltage signals on all word line connection 710 in the selected sector.

In accordance with another aspect of the present invention, the controller for the nonvolatile Flash EEPROM array of the present invention includes circuitry configured to receive externally generated control signals and convert the external signals to internal Flash EEPROM control and data signals. For example, the external signals may be particular address and data signals generated by an Address+ Data Pin Interface Protocol. In accordance with this aspect of the present invention, the external address and data signals may be multiplexed into one external signal which can be processed by the control circuitry of the EEPROM array. In addition, the Flash EEPROM control circuitry may be configured to interface with and support MSDOS, MSDOS Disk Internal Operations, ATA signal protocol, PCMCIA/ATA signal protocol, Compact Flash signal protocol, and any other memory access protocols currently known or developed in the future. For a more detailed discussion of these well known protocols and how they interface with EEPROM or Flash EEPROM devices, see for example, AIMS Specification Release 1.01 and PC Card ATA Mass Storage Specification Release 1.02, both of which are incorporated herein by reference.

In accordance with yet a further aspect of the present invention, the control circuitry may comprise an error control circuit implementing a fault tolerance scheme such as a 1-bit error correcting Hamming Code to support fault tolerance in a multiple bit per transistor coding scheme. As one skilled in the art will appreciate, such error control circuits are well known in the art.

In accordance with yet another aspect of the present invention, the Flash EEPROM control circuitry further comprises a cache memory to optimize both read and write operations. For example, to perform a fast read operation, data stored in the flash memory cell can be dumped into the cache memory, and the data subsequently can be read serially from the cache memory. Similarly, to perform a fast write operation, the data to be written to the flash memory cell can be dumped into the cache memory, and the write operation can occur from the cache memory to the flash memory cell.

In accordance with yet a further aspect of the present invention, all the Flash EEPROM control circuitry is fabricated into a single IC chip. In accordance with one embodiment of the invention, the single IC chip may include the cache memory device.

In addition, in accordance with another embodiment of the invention, the nonvolatile Flash EEPROM transistor array of the present invention may be fabricated into the same IC chip as the control circuitry and cache memory. In accordance with this aspect of the invention, one IC chip will include everything necessary to implement the Flash EEPROM array of the present invention.

In conclusion, the present invention comprises a novel EEPROM design configured for implementing nonvolatile memory structures into large arrays which can be used to form hierarchical memory organizations. While the above is a complete description of the preferred embodiments of the invention, various alternatives, modifications, and equivalents may be used. For example, the size of each array, block and/or sector may be altered to achieve specific design considerations. In addition, a different control circuitry design may be utilized to implement the nonvolatile memory array of the present invention. Therefore, the above description should not be taken as limiting the scope of the invention which is defined by the appended claims.

What is claimed is:

1. A nonvolatile NOR-gate transistor architecture comprising:
   a transistor matrix comprising a plurality of MOS transistors disposed in a matrix of at least two rows and at least two columns, each transistor having a source, a control gate, and a drain, said drains in each column being electrically coupled by a first metal generally disposed at a first layer of said architecture, said control gates in each row being electrically coupled by a second metal generally disposed at the same layer of said architecture as said first layer, and all of said sources being electrically coupled.

2. The nonvolatile transistor architecture of claim 1 wherein said sources disposed in a row are electrically coupled via N+ diffusion.

3. The nonvolatile transistor architecture of claim 1 wherein said plurality of MOS transistors comprises sufficient memory to load MSDOS.

4. The nonvolatile transistor architecture of claim 1 wherein said plurality of MOS transistors comprises sufficient memory to load MSDOS and Disk Internal Operations.

5. The nonvolatile transistor architecture of claim 1 wherein at least a portion of said transistor matrix forms a sector of said transistor architecture, said sector comprising 8 rows and 512 columns of transistors.

6. The nonvolatile transistor architecture of claim 5 wherein a plurality of vertically stacked sectors form a block of said transistor architecture.

7. The nonvolatile transistor architecture of claim 1 wherein said block comprises 128 sectors.

8. The nonvolatile transistor architecture of claim 1 wherein said transistor architecture comprises a plurality of said blocks disposed in a matrix of at least one row and at least one column of said blocks.

9. The nonvolatile transistor architecture of claim 8 further comprising control circuitry including at least one source decoder, at least one bit line decoder and at least one word line decoder.

10. The nonvolatile transistor architecture of claim 9 wherein said at least one source decoder controls inputs to the sources of at least two adjacent blocks in a row.

11. The nonvolatile transistor architecture of claim 9 wherein said at least one word line decoder controls inputs to the word lines of at least two adjacent blocks in a row.

12. The nonvolatile transistor architecture of claim 9 wherein said at least one bit line decoder controls inputs to the bit lines of at least two adjacent blocks in a column.

13. A nonvolatile NOR-gate transistor architecture, comprising:
   a plurality of sectors each comprising a matrix of MOS transistors disposed in rows and columns, e transistor having a source, a control gate, and a drain, said control gates in each row of said transistors in a sector being electrically coupled, said drains in each column of said transistors in a sector being electrically coupled, and all of said sources of said transistors in a sector being electrically coupled, and said drains in each column of transistors in one of said plurality of sectors being electrically coupled to said drains in corresponding columns of transistors in adjacent sectors.

14. The nonvolatile transistor architecture of claim 13 wherein said plurality of sectors comprise a first sector disposed above a second sector.

15. The nonvolatile transistor architecture of claim 13 wherein said plurality of sectors comprise a first sector disposed adjacent to a second sector.

16. The nonvolatile transistor architecture of claim 13 further comprising a controller electrically coupled to at least two sectors.

17. The nonvolatile transistor architecture of claim 16 wherein said controller permits access to only one sector at a time for performing a function on said transistors, said function selected from a group comprising reading, writing, and erasing.

18. The nonvolatile transistor architecture of claim 16 wherein said controller permits access to at least two sectors at a time for performing a first function on said transistors of a first sector and a second function on said transistors of a second sector, said first function and said second function selected from a group comprising reading, writing, and erasing.

19. The nonvolatile transistor architecture of claim 16 where in said controller implements a fault tolerance scheme to support a multiple bit per transistor coding scheme.

20. The nonvolatile transistor architecture of claim 19 wherein said fault tolerance scheme in a one-bit error-correcting Hamming code.

21. The nonvolatile transistor architecture of claim 16 further comprising at least one decoder electrically coupled to said controller and to said sources of at least one sector, said at least one decoder selecting said sector and transmitting source signals to said sources in response to control signals received from said controller.

22. The nonvolatile transistor architecture of claim 21 wherein said control signals are external address and data signals.

23. The nonvolatile transistor architecture of claim 21 further comprising a cache memory electrically coupled to said at least one decoder.

24. The nonvolatile transistor architecture of claim 22 wherein a plurality of said external address and data signals are multiplexed into one control signal.

25. The nonvolatile transistor architecture of claim 21 wherein said sectors, said controllers, and said at least one decoder are formed as a single integrated circuit.

26. The nonvolatile transistor architecture of claim 16 wherein said controller provides control signals that support a protocol convention selected from a group comprising ATA, PCMCIA/ATA, and Compact Flash signal protocol conventions.

27. A nonvolatile NOR-gate transistor architecture, comprising:

a plurality of sectors each comprising a matrix of MOS transistors disposed in rows and columns, each transistor having a source, a control gate, and a drain, said control gates in each row of said transistors in a sector being electrically coupled, said drains in each column of said transistors in a sector being electrically coupled, and all of said sources of said transistors in a sector being electrically, said plurality of sectors forming one or more blocks, each of said one or more blocks comprising two or more of said plurality of sectors vertically stacked, said drains in each column of transistors in each of said two or more of said plurality of vertically stacked sectors being electrically coupled to said drains in corresponding columns of transistors in the other of said two or more of said plurality of vertically stacked sectors.

28. The transistor architecture as recited in claim 27, wherein each of said plurality of sectors comprise 8 rows and 512 columns of transistors.

29. The transistor architecture as recited in claim 28, wherein each of said one or more blocks comprise 128 vertically stacked sectors.

30. The nonvolatile transistor architecture of claim 27, wherein said transistor architecture comprises a plurality of said blocks disposed in a matrix of at least one row and at least one column of said blocks.

31. The nonvolatile transistor architecture of claim 30, further comprising control circuitry including at least one source decoder, at least one bit line decoder and at least one word line decoder.

32. The nonvolatile transistor architecture of claim 31, wherein said at least one source decoder controls inputs to the sources of at least two adjacent blocks in a row, said at least one word line decoder controls inputs to the word lines of at least two adjacent blocks in a row, and said at least one bit line decoder controls inputs to the bit lines of at least two adjacent blocks in a column.

33. The nonvolatile transistor architecture of claim 27, further comprising a controller electrically coupled to said sectors of one or more of said blocks.

34. The nonvolatile transistor architecture of claim 33, wherein said controller permits access to only one sector at a time for performing a function on said transistors, said function selected from a group comprising reading, writing, and erasing.

35. The nonvolatile transistor architecture of claim 33, wherein said controller permits access to at least two sectors at a time for performing a first function on said transistors of a first sector and a second function on said transistors of a second sector, said first function and said second function selected from a group comprising reading, writing, and erasing.

36. A nonvolatile NOR-gate transistor architecture, comprising:

a plurality of sectors each comprising a matrix of MOS transistors disposed in 8 rows and 512 columns, each transistor having a source, a control gate, and a drain, said control gates in each row of said transistors in a sector being electrically coupled, said drains in each column of said transistors in a sector being electrically coupled, and all of said sources of said transistors in a sector being electrically coupled, said drains in each column of transistors in one of said plurality of sectors being electrically coupled to said drains in corresponding columns of transistors in adjacent sectors.

37. The transistor architecture as recited in claim 36, wherein said plurality of sectors form one or more blocks, each of said one or more blocks comprising two or more of said plurality of sectors vertically stacked.

38. The transistor architecture as recited in claim 37, wherein each of said one or more blocks comprises 128 vertically stacked sectors.

39. The nonvolatile transistor architecture of claim 37, wherein said transistor architecture comprises a plurality of said blocks disposed in a matrix of at least one row and at least one column of said blocks.

40. The nonvolatile transistor architecture of claim 39, further comprising control circuitry including at least one source decoder, at least one bit line decoder and at least one word line decoder.

41. The nonvolatile transistor architecture of claim 40, wherein said at least one source decoder controls inputs to the sources of at least two adjacent blocks in a row, said at least one word line decoder controls inputs to the word lines of at least two adjacent blocks in a row, and said at least one bit line decoder controls inputs to the bit lines of at least two adjacent blocks in a column.

42. The nonvolatile transistor architecture of claim 37, further comprising a controller electrically coupled to said sectors of one or more of said blocks.

43. The nonvolatile transistor architecture of claim 42, wherein said controller permits access to only one sector at a time for performing a function on said transistors, said function selected from a group comprising reading, writing, and erasing.

44. The nonvolatile transistor architecture of claim 42, wherein said controller permits access to at least two sectors at a time for performing a first function on said transistors of a first sector and a second function on said transistors of a second sector, said first function and said second function selected from a group comprising reading, writing, and erasing.

* * * * *